United States Patent
Cho et al.

(10) Patent No.: US 8,410,547 B2
(45) Date of Patent: Apr. 2, 2013

(54) SEMICONDUCTOR DEVICE AND METHOD FOR FABRICATING THE SAME

(75) Inventors: Heung-Jae Cho, Icon-shi (KR); Hong-Seon Yang, Ichon-shi (KR); Se-Aug Jang, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/957,231

(22) Filed: Nov. 30, 2010

(65) Prior Publication Data
US 2011/0068393 A1 Mar. 24, 2011

Related U.S. Application Data

(62) Division of application No. 11/967,133, filed on Dec. 29, 2007, now Pat. No. 7,842,594.

(30) Foreign Application Priority Data

May 9, 2007 (KR) ........................ 10-2007-0045065

(51) Int. Cl.
*H01L 29/66* (2006.01)

(52) U.S. Cl. ................ 257/330; 438/270; 257/E21.621

(58) Field of Classification Search .................. 438/270; 257/E21.621, E21.623, E21.629, E21.635, 257/E21.637
See application file for complete search history.

(56) References Cited

U.S. PATENT DOCUMENTS

| 7,238,599 B2 | 7/2007 | Forbes |
| 2004/0259311 A1 | 12/2004 | Kim |
| 2005/0275042 A1* | 12/2005 | Hwang et al. .................. 257/401 |
| 2007/0057318 A1 | 3/2007 | Bach et al. |

OTHER PUBLICATIONS

Ang, "Titanium nitride films with high oxygen concentration", Journal of Electronic Materials, vol. 17, No. 2, 1988, pp. 95-100.*
Work function of Copper www.cem.msu.edu, Fall 2009.*

* cited by examiner

*Primary Examiner* — Fernando L Toledo
*Assistant Examiner* — Sonya McCall Shepard
(74) *Attorney, Agent, or Firm* — Kilpatrick Townsend & Stockton LLP (57) ABSTRACT

A semiconductor device includes a substrate having a recess in an area where a gate is to be formed, spacers formed over sidewalls of the recess, and a first gate electrode filling in the recess. The spacers include material having the first work function or insulation material. The first gate electrode includes material having a second work function, wherein the second work function is higher than that of the spacers.

18 Claims, 11 Drawing Sheets

SEMICONDUCTOR DEVICE AND METHOD FOR FABRICATING THE SAME

CROSS-REFERENCE TO RELATED APPLICATIONS

The present invention is a divisional of U.S. patent application Ser. No. 11/967,133, filed on Dec. 29, 2007, which claims priority of Korean patent application number 10-2007-0045065, filed on May 9, 2007, both of which are incorporated by reference in their entirety.

BACKGROUND OF THE INVENTION

The present invention relates to fabricating a semiconductor device and, more particularly, to a transistor in a semiconductor device and a method for fabricating the same.

Recently, as semiconductor devices become more highly integrated, a conventional two-dimensional transistor structure exhibits various limitations. That is, the conventional two-dimensional transistor structure cannot obtain a data retention characteristic in a highly integrated memory device and cannot satisfy a current drivability required for a high speed device.

In order to overcome such limitations, transistors having various structures have been suggested.

Figure 1:
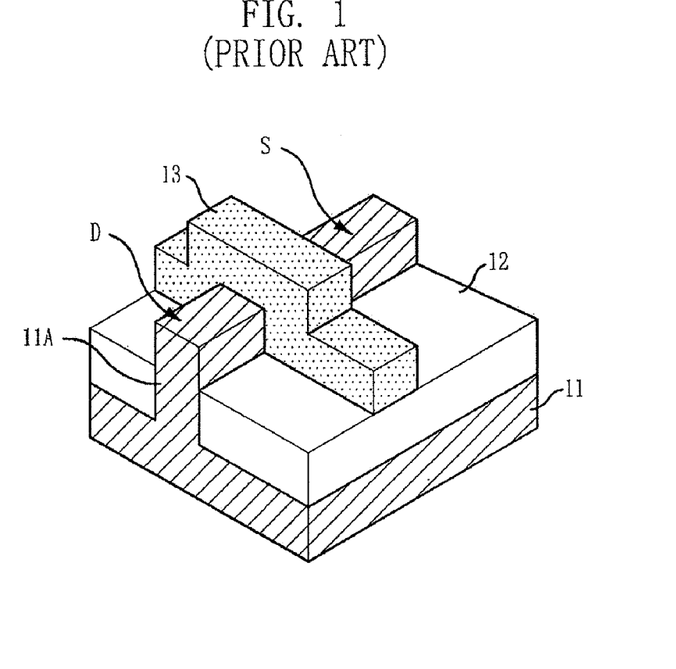
FIG. 1 illustrates a perspective view of a structure of a conventional fin transistor.

FIG. 1 illustrates a perspective view of a conventional fin field effect transistor (fin FET) (hereinafter, referred to as a fin transistor). The fin transistor is provided to obtain the current drivability for a high speed device.

As shown in FIG. 1, the fin transistor includes a substrate 11. A part of the substrate 11 where a channel will be subsequently formed protrudes in a direction perpendicular to an isolation layer 12 to form a fin active area 11A. A gate electrode 13 crossing the fin active area 11A is formed on the isolation layer 12. Since three surfaces of the substrate 11 surrounded by the gate electrode 13 are used as a channel of the transistor, the current drivability of the device may be improved. Reference symbols S and D represent a source region and a drain region, respectively.

However, because the channel of the fin transistor is defined by three surfaces, it is difficult to raise a threshold voltage above a certain level. Accordingly, the fin transistor is rarely used as a cell transistor in a memory device such as a dynamic random access memory (DRAM) which requires a high threshold voltage of approximately 0.8 V or more. The reason for this is that when the threshold voltage is not raised above a certain level in the memory device such as the DRAM, an off-leakage characteristic is considerably deteriorated. Therefore, in order to employ the fin transistor as a cell transistor in the memory device, increasing the threshold voltage of the fin transistor is required.

Generally, an NMOS transistor is employed as a cell transistor in the memory device. Accordingly, a method to increase the threshold voltage of the fin transistor uses a polysilicon layer doped with p-type impurities (for instance, boron B) (hereinafter, referred to as P+ polysilicon layer) as a gate electrode of a fin transistor instead of using a conventional polysilicon layer doped with n-type impurities (for instance, phosphorus P) (hereinafter, referred to as N+ polysilicon layer). Theoretically, a work function of the P+ polysilicon is greater than that of the N+ polysilicon by approximately 1.0 eV so that the threshold voltage of the fin transistor can be increased by approximately 0.8 V to approximately 1.0 V due to the replacement of the gate electrode mentioned above.

Figure 2A:
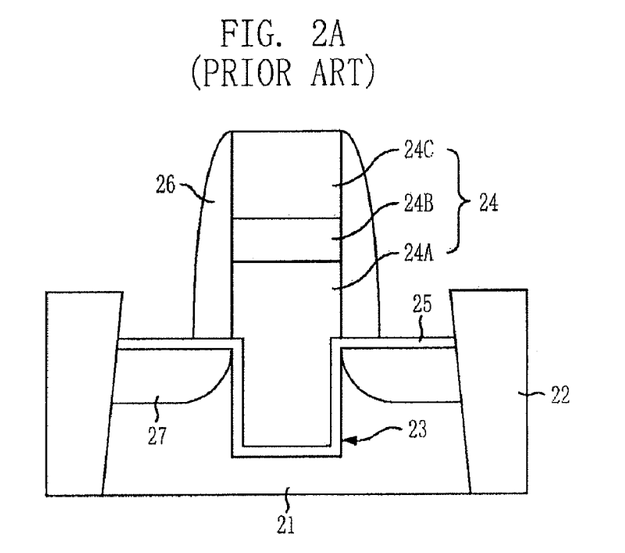
FIG. 2A illustrates a cross-sectional view of a conventional NMOS transistor structure using a P+ polysilicon gate electrode.
Figure 2B:
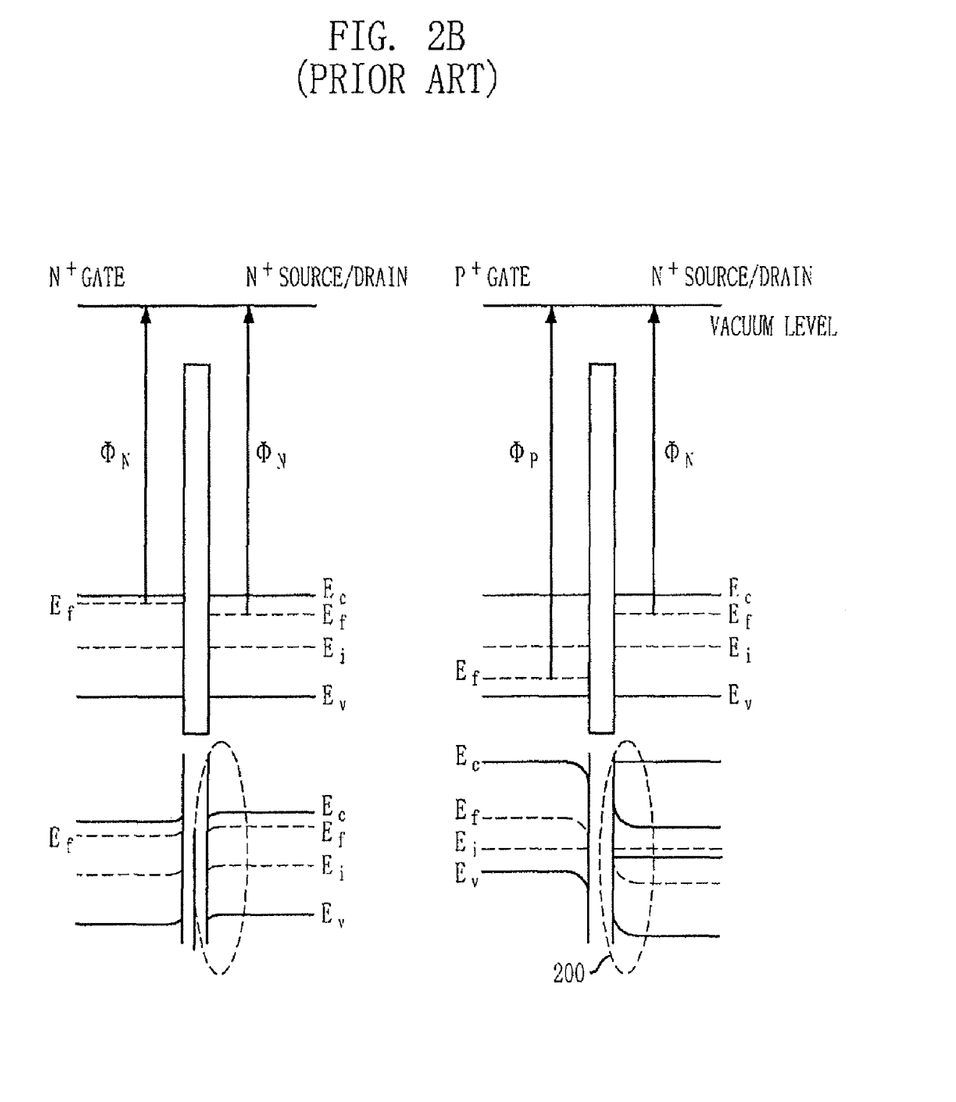
FIG. 2B illustrates an energy band diagram for explaining a limitation of the transistor structure shown in FIG. 2A.

FIG. 2A illustrates a cross-sectional view of a conventional NMOS transistor structure using a P+ polysilicon gate electrode, and FIG. 2B illustrates an energy band diagram for explaining a limitation of the transistor structure shown in FIG. 2A. The transistor in FIG. 2A has a recess gate structure to obtain a data retention characteristic in a highly integrated memory device.

As shown in FIG. 2A, the transistor includes a gate 24. A P+polysilicon gate electrode 24A, a low resistance gate electrode 24B and a gate hard mask 24C are stacked on a recess 23 to form the gate 24. The recess 23 is formed by etching an active area of a substrate 21. The active area is defined by an isolation layer 22. A gate insulation layer 25 is interposed between the gate 24 and the substrate 21. Gate spacers 26 are formed on opposite sidewalls of the gate 24. N-type source/drain regions 27 are formed in the substrate 21 at both sides of the gate 24.

However, when the NMOS transistor having the P+ polysilicon gate electrode as shown in FIG. 2A is used, the following limitations may occur. The limitations will be described with reference to the energy band diagram of FIG. 2B by comparing a case where the P+ polysilicon gate electrode is formed on a gate oxide layer and an n-type source/drain junction with a case where an N+ polysilicon gate electrode is formed on the gate oxide layer and the n-type source/drain junction.

Generally, as described above, a work function of the P+ polysilicon $\phi_P$ is approximately 5.2 eV and the work function of the N+ polysilicon $\phi_N$ is approximately 4.2 eV so that the work function of the P+ polysilicon $\phi_P$ is greater than that of the N+ polysilicon $\phi_N$ by approximately 1.0 eV. Accordingly, referring to the energy band diagram of FIG. 2B, when using the P+ polysilicon gate electrode, it shows a greater band bending phenomenon (refer to 200 in FIG. 2B) at a gate oxide layer/junction interface as a difference in the work functions between the P+ polysilicon and the N+ polysilicon becomes greater. Therefore, when using the P+ polysilicon gate electrode, a gate induced drain leakage (GIDL) characteristic is degraded compared to the case when using the N+ polysilicon gate electrode. Accordingly, the data retention characteristic of the memory device is also degraded.

The degradation of the GIDL characteristic also occurs in the fin transistor structure shown in FIG. 1 even if the P+ polysilicon gate electrode is used instead of the N+ polysilicon gate electrode to improve the threshold voltage.

Accordingly, when fabricating the device employing the fin transistor or the recess gate transistor, raising a threshold voltage and improving the GIDL characteristic is required.

SUMMARY OF THE INVENTION

Embodiments of the present invention are directed to providing a transistor in a semiconductor device and a method for fabricating the same. The transistor is capable of improving an electrical characteristic of the device through raising the threshold voltage and improving a gate induced drain leakage (GIDL) characteristic by forming a gate electrode which includes material having a high work function, and placing material having a low work function or insulation material at an area where source/drain regions make contact with the gate electrode to separate the gate electrode from the source/drain regions.

According to a first aspect of the present invention, a semiconductor device includes a substrate having a recess in an area where a gate is to be formed; spacers formed over sidewalls of the recess, wherein the spacers include material having a first work function or insulation material; and a first gate electrode filling in the recess having the spacers, wherein the first gate electrode includes material having a second work function, wherein the second work function is higher than the first work function.

According to a second aspect of the present invention, a method for fabricating a transistor includes forming a recess by etching a gate target region in a substrate; forming a first gate insulation layer over a surface of the substrate having the recess, thereby forming a first resultant structure; forming spacers over sidewalls of the recess, wherein the spacers include material having a first work function or an insulation material; forming a second gate insulation layer over the spacers, thereby forming a second resultant structure; and forming a first conductive layer for a gate electrode over the second resultant structure and filling the recess, wherein the first conductive layer includes material having a second work function, wherein the second work function is higher than the first work function.

According to a third aspect of the present invention, a semiconductor device includes a substrate having an active area defined by an isolation layer; a first groove formed in a channel area of the active area; a second groove formed in a part of the isolation layer, and having a depth deeper than that of the first groove; spacers formed over sidewalls of the first groove, and including material having a first work function or insulation material; a first gate electrode overlapping with the first groove and the second groove while passing through the active area, wherein the first gate electrode includes material having a second work function, wherein the second work function is higher than the first work function; and source/drain regions formed in the active area at both sides of the first gate electrode.

According to a fourth aspect of the present invention, a method for fabricating a semiconductor device includes forming an active area by forming an isolation layer on a substrate; forming a first groove by etching a channel area in the active area; forming a first gate insulation layer over a surface of the active area having the first groove, thereby forming a first resultant structure; forming spacers, which include material having a first work function or insulation material, over sidewalls of the first groove; forming a second groove by etching a part of the isolation layer such that the second groove has a depth deeper than that of the first groove; forming a second gate insulation layer over a surface of the spacers and a surface of the active area exposed by the second groove; forming a first gate electrode overlapping with the first groove and the second groove crossing the active area, wherein the first gate electrode comprises material having a second work function, wherein the second work function is higher than the first work function, and forming source/drain regions in the active area at both sides of the first gate electrode.

DETAILED DESCRIPTION OF THE PREFERRED EMBODIMENTS

Hereinafter, a semiconductor memory device in accordance with the present invention will be described in detail referring to the accompanying drawings.

FIGS. 3A to 3F illustrate cross-sectional views of a method for fabricating a transistor according to one embodiment of the present invention. Particularly, FIGS. 3A to 3F illustrate a method for fabricating a transistor having a recess gate structure.

Figure 3A:
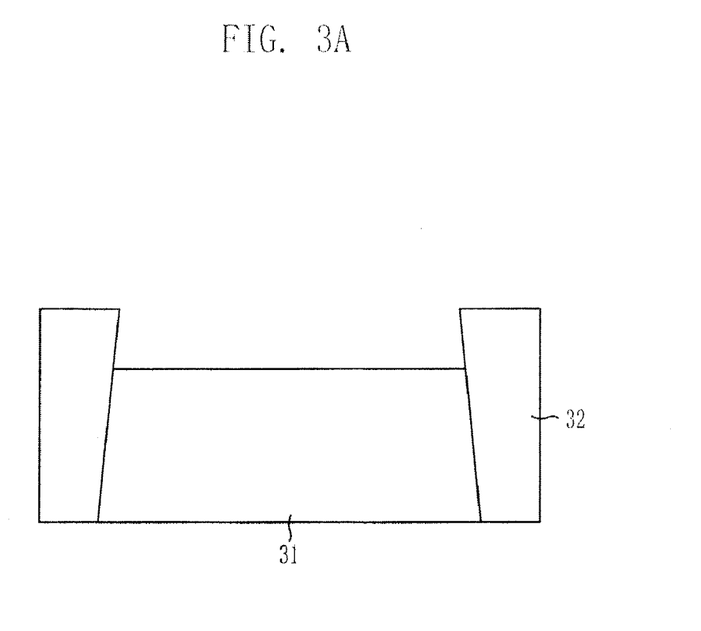
FIGS. 3A to 3F illustrate cross-sectional views of a method for fabricating a transistor according to one embodiment of the present invention.

As shown in FIG. 3A, an isolation layer 32 is formed on a substrate 31 to define an active area of the substrate 31.

Figure 3B:
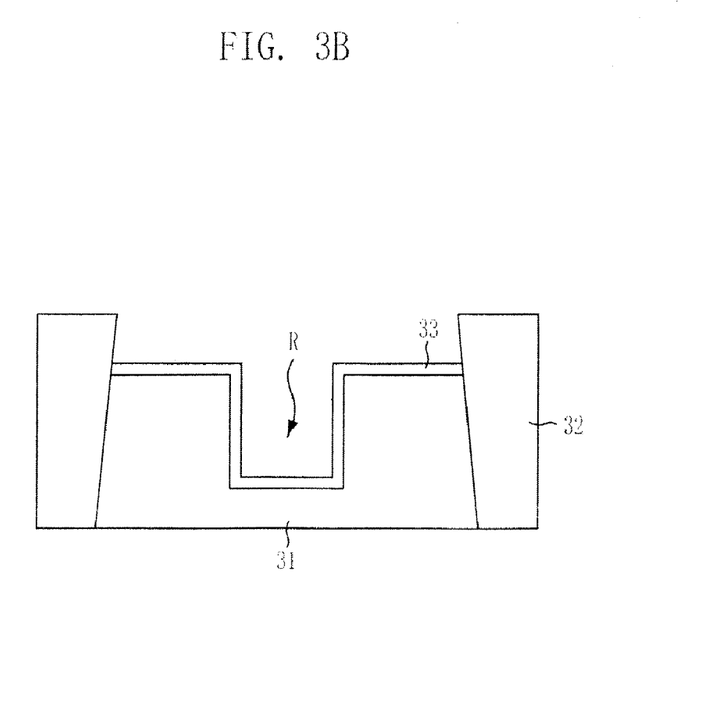

As shown in FIG. 3B, a portion in the active area of the substrate 31 where a gate is to be formed is selectively etched to form a recess R. Preferably, the recess R has a depth ranging from approximately 500 Å to approximately 5,000 Å. A first gate insulation layer 33 is formed on a surface of the active area of the substrate 31 having the recess R. Preferably, the first gate insulation layer 33 has a thickness ranging from approximately 10 Å to approximately 100 Å, and the first gate insulation layer 33 includes an oxide layer (for instance, a $SiO_2$ layer) or a high-k dielectric layer having a dielectric constant greater than that ($\approx 3.9$) of the $SiO_2$ layer. When the first gate insulation layer 33 includes the oxide layer, the first gate insulation layer 33 can be formed by a wet oxidation process, a dry oxidation process and a radical oxidation process, or a combination thereof.

Figure 3C:
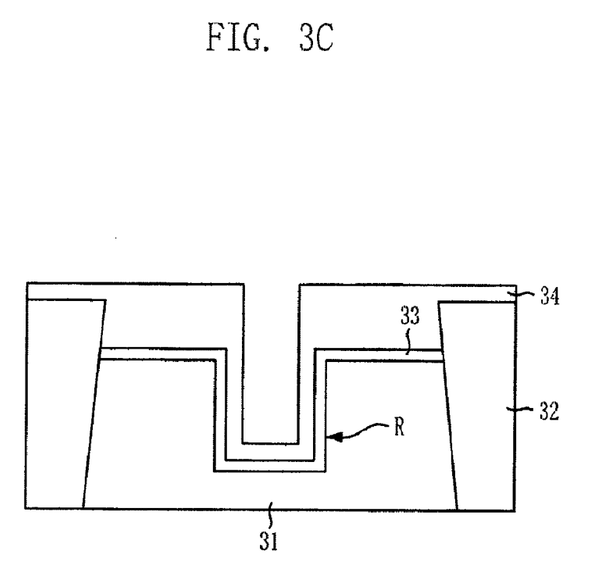

As shown in FIG. 3C, material layer 34 for a spacer, which includes material having a low work function or an insulation material, is deposited on a first resultant structure including the first gate insulation layer 33. The material having the low work function has a work function approximately 4.6 eV or less, and the material may include a semiconductor or a conductor.

Figure 3D:
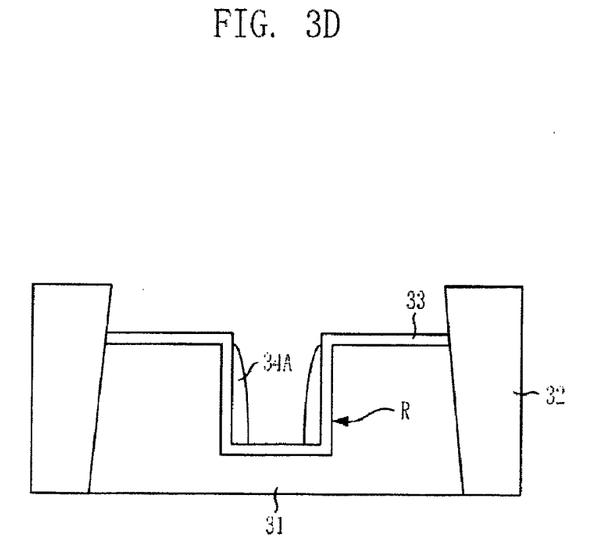

As shown in FIG. 3D, an etch back process is performed on the material layer 34 until the first gate insulation layer 33 is exposed, such that a spacer 34A is formed on sidewalls of the recess R. While the etch back process is performed, the material layer 34 formed on a bottom surface of the recess R is removed as well as the material layer 34 formed on a surface of the substrate 31. A gate electrode and source/drain regions, which are formed through a subsequent process, are separated from each other by the spacer 34A such that a gate induced drain leakage GIDL characteristic is improved.

Figure 3E:
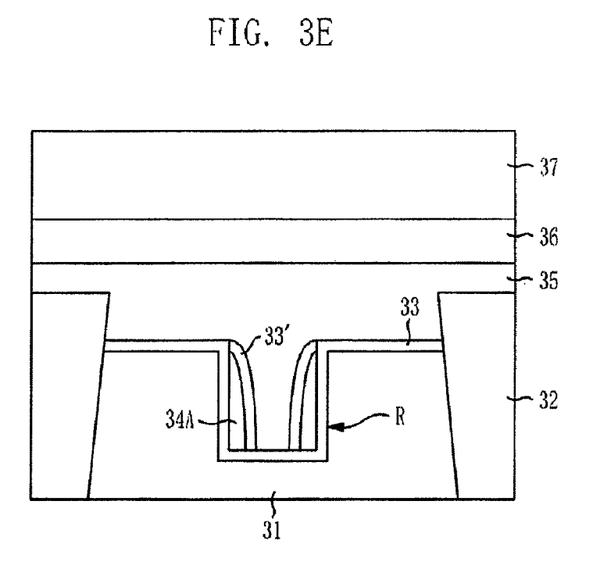

As shown in FIG. 3E, after performing a cleaning process, a second gate insulation layer 33' is formed over the spacer 34A through a gate insulation layer reforming process. Referring to FIG. 3E, the second gate insulation layer 33' is shown formed only on the spacer 34A, however, the present invention is not limited thereto. In addition, damaged parts of the first gate insulation layer 33 can be compensated for by the etch back process, the cleaning process, etc. Preferably, the second gate insulation layer 33' includes the oxide layer (for instance, the $SiO_2$ layer) or the high-k dielectric layer having the dielectric constant greater than that ($\approx 3.9$) of the $SiO_2$ layer.

A first conductive layer 35 for a gate electrode, which is filled in the recess R, is formed on a second resultant structure. The first conductive layer 35 for the gate electrode includes material having a high work function. For example, the work function of the material for the first conductive layer 35 is greater than that of the material included in the spacer 34A. Preferably, the material for the first conductive layer 35 has a work function of approximately 4.4 eV or more.

Since the material having a high work function is used as the gate electrode, a threshold voltage of the transistor is raised, thereby improving the characteristics of the device. Subsequently, a second conductive layer 36 for a gate electrode and an insulation layer 37 for a gate hard mask each include low-resistivity material, and are sequentially formed over the first conductive layer 35 for the gate electrode.

Figure 3F:
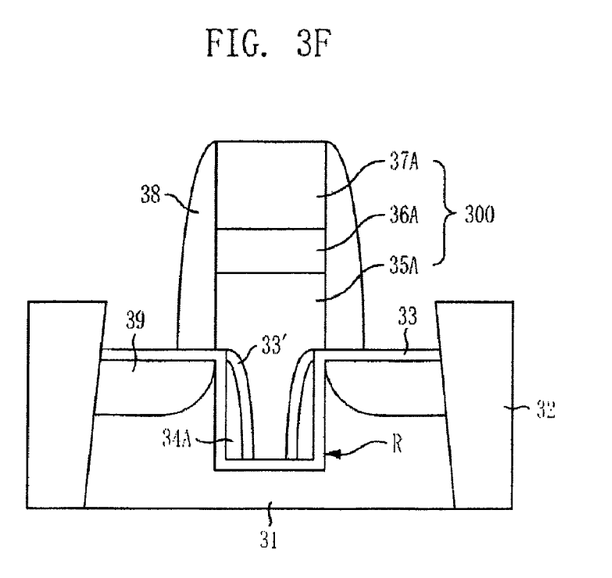

As shown in FIG. 3F, the insulation layer 37, the second conductive layer 36 and the first conductive layer 35 are patterned through mask and etching processes, thereby forming a gate pattern 300 in which a first gate electrode 35A, a second gate electrode 36A and a gate hard mask 37A are sequentially stacked. Gate spacers 38 are formed over sidewalls of the gate pattern 300, and source/drain regions 39 are formed in the substrate 31 at both sides of the gate pattern 300. As a result, the transistor according to one embodiment of the present invention is obtained.

Referring to the transistor structure according to one embodiment of the present invention, in FIG. 3F, the threshold voltage of the transistor is raised using the high work function material as the first gate electrode 35A. The GIDL characteristic is deteriorated when the threshold voltage of the transistor is raised. However, the GIDL characteristic can be improved by forming the spacers 34A on both sidewalls of the recess R. The spacers 34A include material having a low work function or insulation material. The spacers 34A separate source/drain regions 39 from the first gate electrode 35A, which is filled in the recess R.

FIGS. 4A to 4I illustrate perspective and cross-sectional views of a method for fabricating a transistor according to a second embodiment of the present invention. Particularly, FIGS. 4A to 4I illustrate a method for fabricating a saddle transistor, which can simultaneously realize a recess gate structure and a fin transistor structure.

Figure 4A:
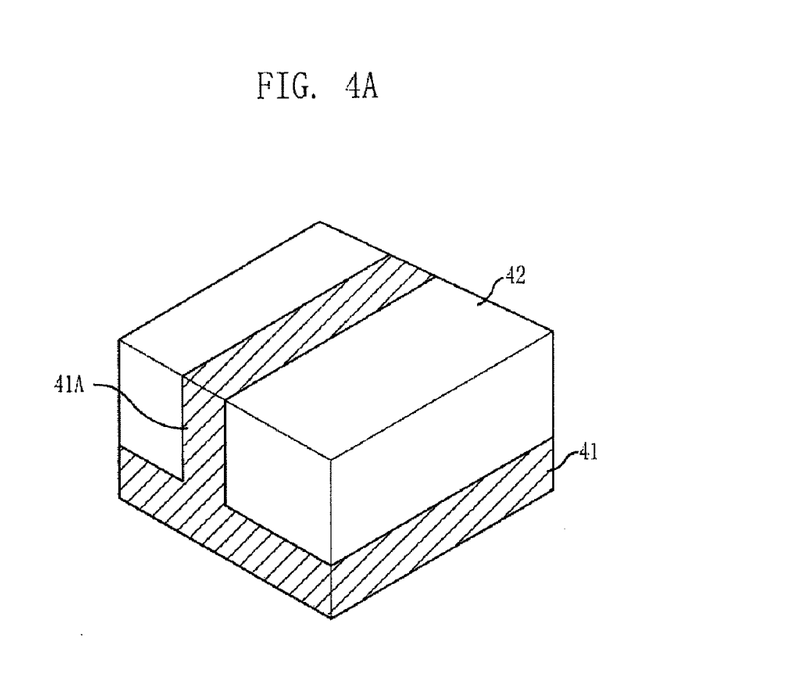
FIGS. 4A to 4I illustrate perspective and cross-sectional views of a method for fabricating a transistor according to a second embodiment of the present invention.

As shown in FIG. 4A, an isolation layer 42 is formed on a substrate 41 to define an active area 41A.

Figure 4B:
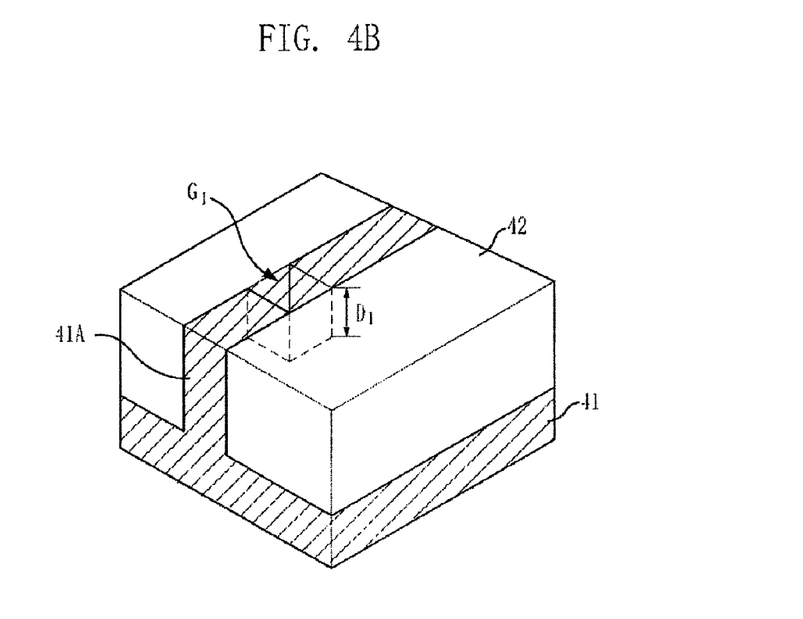

As shown in FIG. 4B, a first groove G1 is formed in a channel region of the active area 41A. The first groove G1 is used to form the recess gate transistor structure and corresponds to the recess R shown in FIG. 3. A depth D1 of the first groove G1 is smaller than a thickness of the isolation layer 42. Preferably, the first groove G1 has the depth D1 ranging from approximately 500 Å to approximately 5,000 Å.

Figure 4C:
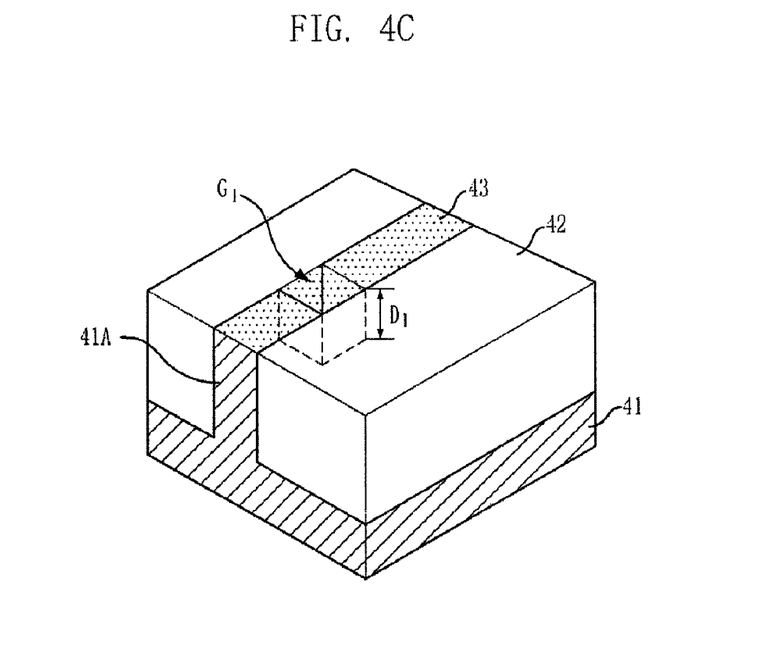

As shown in FIG. 4C, a first gate insulation layer 43 is formed on a surface of the active area 41A having the first groove G1. Preferably, the first gate insulation layer 43 has a thickness ranging from approximately 10 Å to approximately 100 Å. The first gate insulation layer 43 includes an oxide layer (for instance, a $SiO_2$ layer) or a high-k dielectric layer having a dielectric constant greater than that ($\approx 3.9$) of the $SiO_2$ layer. When the first gate insulation layer 43 includes the oxide layer, the first gate insulation layer 43 can be formed by a wet oxidation process, a dry oxidation process and a radical oxidation process, or a combination thereof.

Figure 4D:
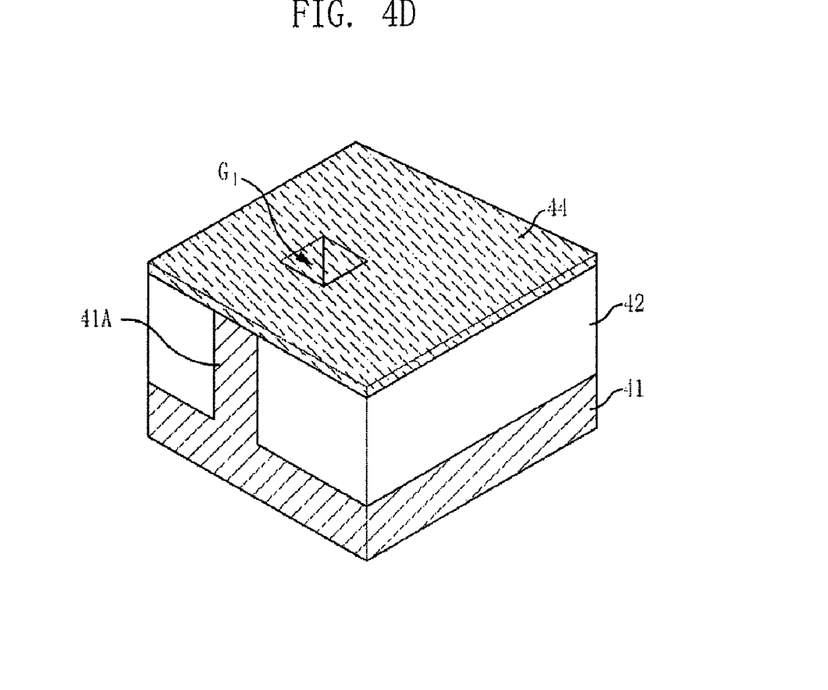

As shown in FIG. 4D, material layer 44 for a spacer, which includes material having a low work function or an insulation material, is deposited on the first gate insulation layer 43 and the isolation layer 42. The material having the low work function has a work function approximately 4.6 eV or less, and the material may include a semiconductor or a conductor.

Figure 4E:
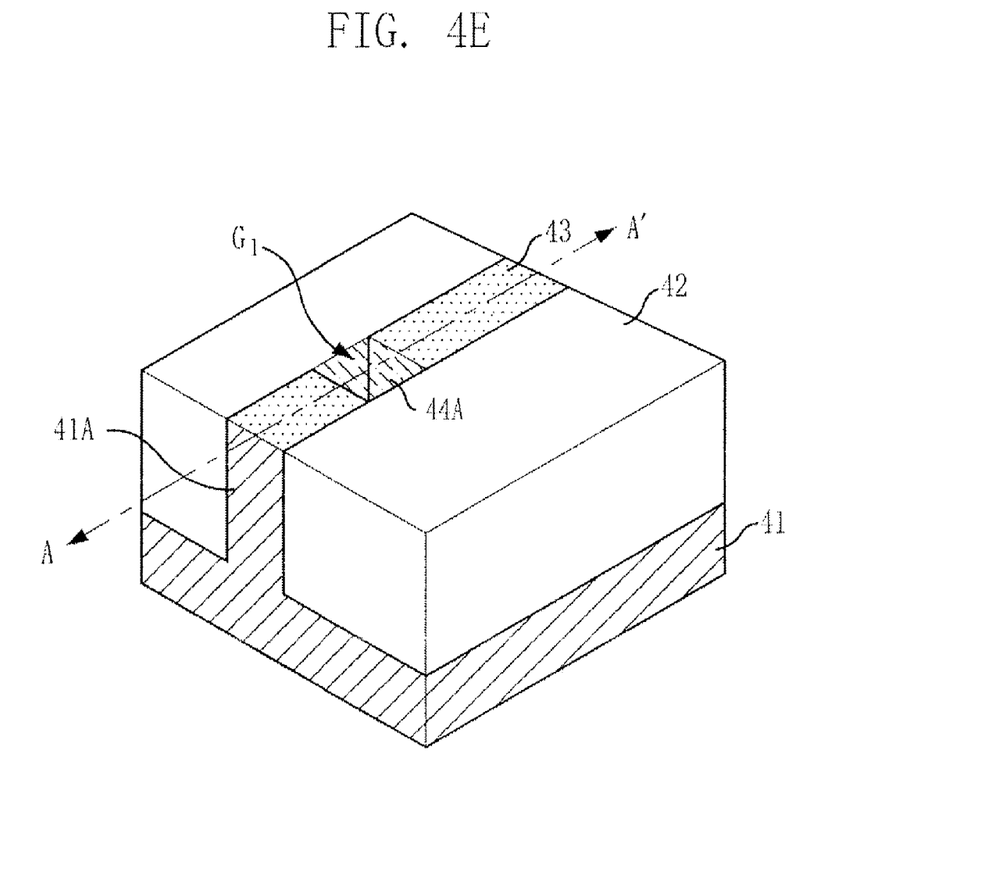

As shown in FIG. 4E, an etch back process is performed on the material layer 44 until the first gate insulation layer 43 and the isolation layer 42 are exposed, such that a spacer 44A is formed on a sidewall of the first groove G1. While the etch back process is performed, the material layer 44 formed on surfaces of the active area 41A and the isolation layer 42 is removed together with the material layer 44 formed on a bottom surface of the first groove G1, so that the first gate insulation layer 43 formed on the surface of the active area 41A and the bottom surface of the first groove G1 is exposed. A gate electrode and source/drain regions, which are formed through a subsequent process, are separated from each other by the spacer 44A such that the GIDL characteristic is improved.

Figure 4F:
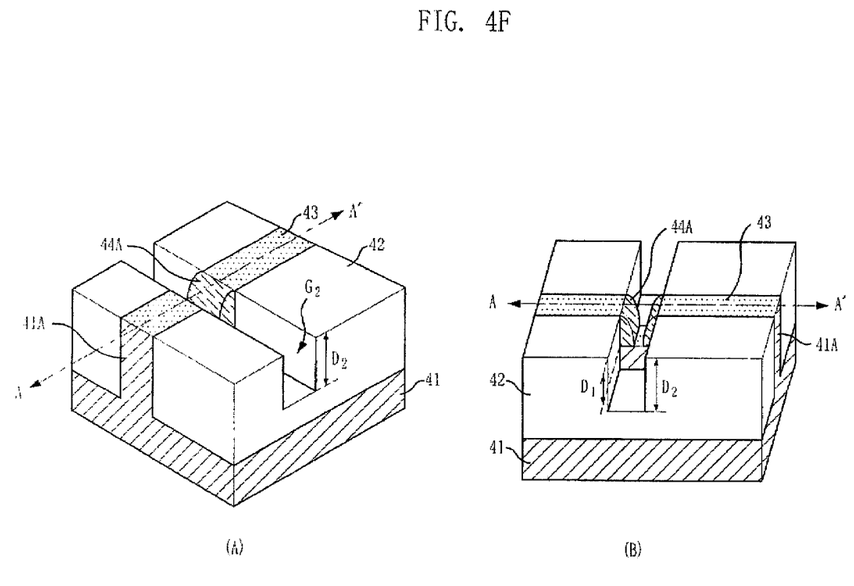

As shown in FIG. 4F, the isolation layer 42 is etched to form the fin transistor structure. Particularly, a part of the isolation layer 42, through which the gate electrode passes, is selectively etched to form a second groove G2. A depth D2 of the second groove G2 is deeper than the depth D1 of the first groove G1. Two perspective views of A and B in FIG. 4F illustrate the above structure in different directions. Referring to FIG. 4F, the fin transistor having the active area 41A which protrudes onto the isolation layer 42 can be achieved by forming the second groove G2, when viewed in a sectional view taken along line A to A'.

Figure 4G:
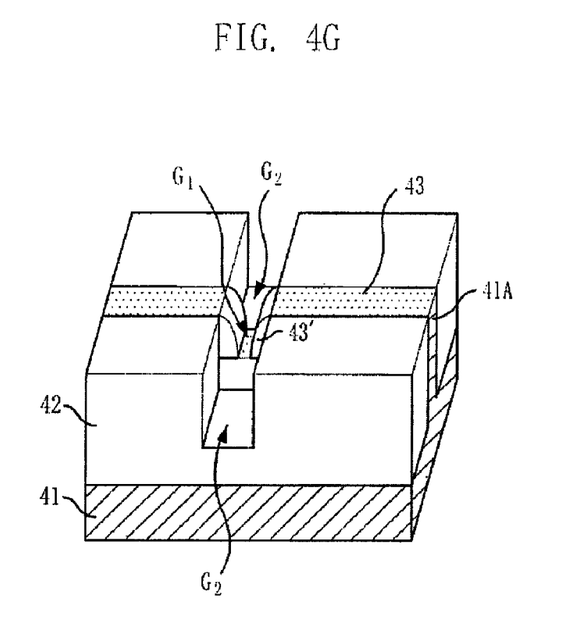

As shown in FIG. 4G, after performing a cleaning process, a second gate insulation layer 43' is formed on the surface of the active area 41A and the surface of the spacer 44A, which are exposed by the second groove G2 through a gate insulation layer reforming process. In FIG. 4G, the second gate insulation layer 43' is shown as it is formed in a region where the first gate insulation layer 43 is not formed, however, the present invention is not limited thereto. In addition, damaged parts of the first gate insulation layer 43 can be compensated for by the etch back process, the cleaning process, etc. Preferably, the second gate insulation layer 43' includes the oxide layer (for instance, a $SiO_2$ layer) or the high-k dielectric layer having the dielectric constant greater than that ($\approx 3.9$) of the $SiO_2$ layer.

Figure 4H:
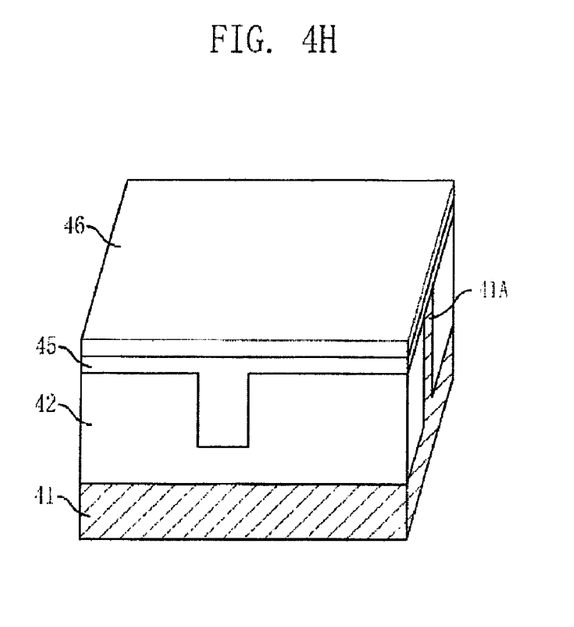

As shown in FIG. 4H, a first conductive layer 45 for a gate electrode, which is filled in the first groove G1 and the second groove G2, is formed on a third resultant structure. The first conductive layer 45 includes material having a high work function. For example, the work function of the material included in the first conductive layer 45 is greater than that of the material included in the spacer 44A. Preferably, the material included in the first conductive layer 45 has a work function of approximately 4.4 eV or more. Since the material having a high work function is used as the gate electrode, a threshold voltage of the transistor is raised thereby improving the characteristics of the device. Subsequently, a second conductive layer 46 for a gate electrode, which includes low-resistivity material, is formed on the first conductive layer 45.

Figure 4I:
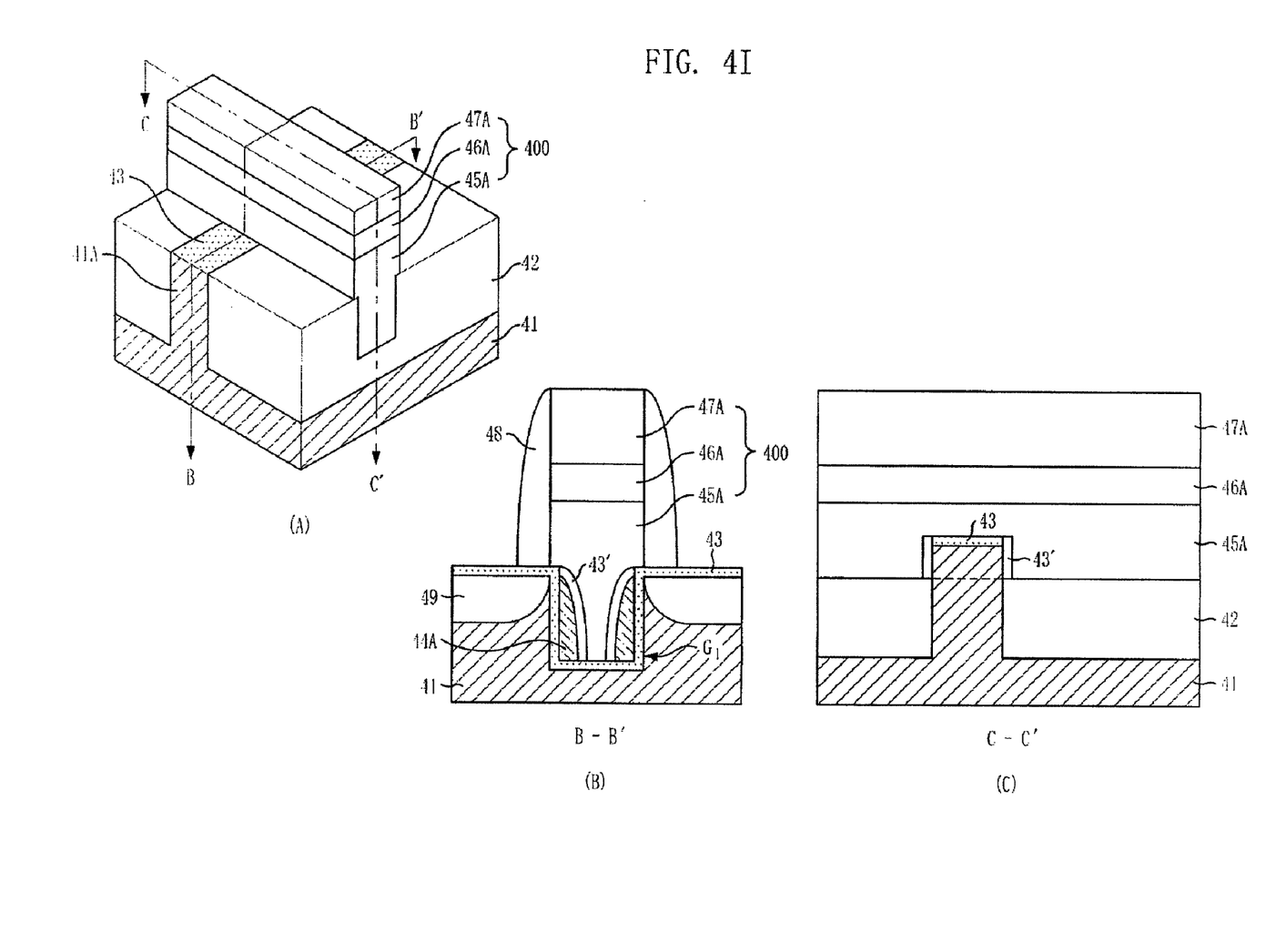

As shown in FIG. 4I, after forming an insulation layer for a gate hard mask over the second conductive layer 46, the insulation layer, the second conductive layer 46 and the first conductive layer 45 are patterned through mask and etching processes, thereby forming a gate pattern 400 in which a first gate electrode 45A, a second gate electrode 46A and a gate hard mask 47A are sequentially stacked. The gate pattern 400 overlaps with the first groove G1 and the second groove G2 while crossing the active area 41A. Gate spacers 48 are formed over both sidewalls of the gate pattern 400, and source/drain regions 49 are formed in the active area 41A at both sides of the gate pattern 400.

FIG. 4I illustrates a perspective view (A) and two sectional views thereof in a direction of B-B' (B) and C-C' (C), respectively.

Referring to (B) in FIG. 4I, the transistor according to the second embodiment of the present invention has the recess gate transistor structure in the direction of B-B' (that is, a source and drain line). Referring to (C) in FIG. 4I, the transistor has the fin transistor structure, which uses three surfaces as the channel, in the direction of C-C' (that is, a gate line). Therefore, the transistor according to the second embodiment of the present invention has a saddle transistor structure.

Accordingly, a current drivability and a data retention characteristic of the device are simultaneously satisfied. In addition, the threshold voltage of the transistor is raised by using the material having a high work function as the first gate electrode 45A. The GIDL characteristics can be improved by forming the spacers 44A, which include a material having a low work function or an insulation material, on both sidewalls of the first groove G1. The spacers 44A separate source/drain regions 49 from the first gate electrode 45A, which is filled in the first groove According to the transistor in the semiconductor device and the method for fabricating the same of the present invention, the gate electrode, which includes material having a high work function, is formed such that the gate electrode can be spaced apart from the source/drain regions by positioning material having a low work function or an insulation material in a region which makes contact with the source/drain regions. Thus, a threshold voltage is raised and the GIDL characteristic is improved, so that electrical characteristics of the device can be improved.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A semiconductor device comprising:
    a substrate having a recess in an area where a gate is to be formed;
    spacers formed over sidewalls of the recess, wherein the spacers include material having a first work function;
    a first gate electrode filling in the recess between the spacers, wherein the first gate electrode includes material having a second work function, wherein the second work function is higher than the first work function; and
    a gate insulation layer interposed between the substrate and the spacer, between the substrate and the first gate electrode, and between the spacer and the first gate electrode.

2. The semiconductor device of claim 1, wherein the first work function is approximately 4.6 eV or less.

3. The semiconductor device of claim 1, wherein the material having the first work function includes a semiconductor or a conductor.

4. The semiconductor device of claim 1, wherein the second work function is approximately 4.4 eV or more.

5. The semiconductor device of claim 1, wherein the recess has a depth ranging from approximately 500 Å to approximately 5,000Å.

6. The semiconductor device of claim 1, wherein the gate insulation layer includes an oxide layer.

7. The semiconductor device of claim 1, wherein the gate insulation layer includes a $SiO_2$ layer or a high-k dielectric layer having a dielectric constant greater than that of the $SiO_2$ layer.

8. The semiconductor device of claim 1, further comprising source/drain regions formed in the substrate at both sides of the first gate electrode.

9. The semiconductor device of claim 1, further comprising:
    a second gate electrode formed over the first gate electrode, wherein the second gate electrode includes low-resistivity material;
    a gate hard mask formed over the second gate electrode; and
    gate spacers formed over sidewalls of a structure which is formed by stacking the first gate electrode, the second gate electrode and the gate hard mask.

10. A semiconductor device comprising:
    a substrate having an active area defined by an isolation layer;
    a first groove formed in a channel area of the active area;
    a second groove formed in a part of the isolation layer, the second groove having a depth deeper than that of the first groove;
    spacers formed over sidewalls of the first groove, the spacers comprising material having a first work function or an insulation material;
    a first gate electrode overlapping with the first groove and the second groove and passing through the active area, wherein the first gate electrode includes material having a second work function, wherein the second work function is higher than the first work function; and
    source/drain regions formed in the active area at both sides of the first gate electrode.

11. The semiconductor device of claim 10, wherein the first work function is approximately 4.6 eV or less.

12. The semiconductor device of claim 10, wherein the material having the first work function includes a semiconductor or a conductor.

13. The semiconductor device of claim 10, wherein the second work function is approximately 4.4 eV or more.

14. The semiconductor device of claim 10, wherein the first groove has a depth ranging from approximately 500 Å to approximately 5,000 Å.

15. The semiconductor device of claim 10, further comprising a gate insulation layer formed over a surface of the active area exposed by the first groove, a surface of the spacer, and a surface of the active area exposed by the second groove.

16. The semiconductor device of claim 15, wherein the gate insulation layer includes an oxide layer.

17. The semiconductor device of claim 15, wherein the gate insulation layer includes a $SiO_2$ layer or a high-k dielectric layer having a dielectric constant greater than that of the $SiO_2$ layer.

18. The semiconductor device of claim 10, further comprising:
    a second gate electrode formed over the first gate electrode, wherein the second gate electrode includes low-resistivity material;
    a gate hard mask formed over the second gate electrode; and
    gate spacers formed over sidewalls of a structure which is formed by stacking the first gate electrode, the second gate electrode and the gate hard mask.

* * * * *